United States Patent
Hwang et al.

(10) Patent No.: US 11,281,574 B2
(45) Date of Patent: Mar. 22, 2022

(54) APPARATUS AND METHOD FOR PROCESSING DIFFERENT TYPES OF DATA IN MEMORY SYSTEM

(71) Applicant: SK hynix Inc., Gyeonggi-do (KR)

(72) Inventors: Sung-Phil Hwang, Gyeonggi-do (KR); Soo-Nyun Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 69 days.

(21) Appl. No.: 16/706,312

(22) Filed: Dec. 6, 2019

(65) Prior Publication Data
US 2020/0334139 A1 Oct. 22, 2020

(30) Foreign Application Priority Data

Apr. 18, 2019 (KR) .......... 10-2019-0045679

(51) Int. Cl.
| | |
|---|---|
| *G06F 12/02* | (2006.01) |
| *G06F 12/0882* | (2016.01) |
| *G11C 16/34* | (2006.01) |
| *G06F 11/07* | (2006.01) |

(52) U.S. Cl.
CPC ........ *G06F 12/0246* (2013.01); *G06F 11/076* (2013.01); *G06F 12/0253* (2013.01); *G06F 12/0882* (2013.01); *G11C 16/349* (2013.01); *G06F 2212/7201* (2013.01); *G06F 2212/7207* (2013.01); *G06F 2212/7211* (2013.01)

(58) Field of Classification Search
None
See application file for complete search history.

(56) References Cited

U.S. PATENT DOCUMENTS

| | | | | |
|---|---|---|---|---|
| 9,158,476 | B2* | 10/2015 | Lai | G06F 3/0688 |
| 9,268,554 | B2* | 2/2016 | Lee | G06F 3/0632 |
| 10,049,042 | B2 | 8/2018 | Tsuruya et al. | |
| 2008/0235489 | A1* | 9/2008 | Gorobets | G06F 12/0246 |
| | | | | 711/217 |
| 2010/0185830 | A1* | 7/2010 | Asnaashari | G06F 12/0246 |
| | | | | 711/206 |
| 2013/0073816 | A1* | 3/2013 | Seo | G06F 3/0679 |
| | | | | 711/154 |
| 2015/0178194 | A1* | 6/2015 | Shaharabany | G06F 12/0253 |
| | | | | 711/171 |
| 2016/0342458 | A1* | 11/2016 | Cai | G11C 16/349 |
| 2017/0147503 | A1* | 5/2017 | de Silva | G06F 3/0652 |

(Continued)

FOREIGN PATENT DOCUMENTS

KR 10-1480420 1/2015

*Primary Examiner* — Yaima Rigol
(74) *Attorney, Agent, or Firm* — IP & T Group LLP

(57) ABSTRACT

A memory system may include: a nonvolatile memory device including a plurality of memory blocks, each memory block including a plurality of pages; and a controller suitable for controlling the nonvolatile memory device to store user data received from a host in a first block among the memory blocks, to store metadata in a second block among the memory blocks, and to generate the metadata corresponding to storage of the user data, the controller may map a first logical address used in the host to a physical address of the first block, and may map a second logical address not used in the host, to a physical address of the second block, the first logical address and the second logical address being successive.

16 Claims, 7 Drawing Sheets

(56) References Cited

U.S. PATENT DOCUMENTS

| | | | |
|---|---|---|---|
| 2017/0220264 A1* | 8/2017 | Sokolov | G06F 3/064 |
| 2018/0267901 A1* | 9/2018 | Zhou | G06F 12/10 |
| 2019/0079859 A1* | 3/2019 | Li | G11C 16/3495 |
| 2019/0087328 A1* | 3/2019 | Kanno | G06F 12/0261 |
| 2019/0107964 A1* | 4/2019 | Liang | G06F 3/0614 |

* cited by examiner

APPARATUS AND METHOD FOR PROCESSING DIFFERENT TYPES OF DATA IN MEMORY SYSTEM

CROSS-REFERENCE TO RELATED APPLICATION

This application claims priority under 35 U.S.C. § 119 to Korean Patent Application No. 10-2019-0045679 filed on Apr. 18, 2019, which is incorporated herein by reference in its entirety.

BACKGROUND

1. Field

Various embodiments relate to a memory system and an operating method thereof, and more particularly, to a memory system and an operating method thereof capable of processing data stored in a plurality of memory blocks in the memory system, regardless of types of data.

2. Discussion of the Related Art

The computer environment paradigm has changed to ubiquitous computing systems that can be used anytime and anywhere. As a result, use of portable electronic devices such as mobile phones, digital cameras, and notebook computers has rapidly increased. These portable electronic devices generally use a memory system having one or more memory devices for storing data. A memory system may be used as a main or an auxiliary storage device of a portable electronic device.

Memory systems provide excellent stability, durability, high information access speed, and low power consumption because they have no moving parts. Examples of memory systems having such advantages include universal serial bus (USB) memory devices, memory cards having various interfaces, and solid-state may drive (SSDs).

SUMMARY

Various embodiments are directed to a memory system and an operating method thereof capable of managing in an integrated manner both a user block and a metablock, based on logical addresses.

Also, various embodiments are directed to a memory system and an operating method thereof in which user data may be controlled using a first logical address used in a hosting or computing device and metadata may be controlled by allocating a second logical address not used in the hosting or computing device.

It is to be understood that technical objects to be achieved by the disclosure are not limited to the aforementioned technical objects and other technical objects which are not mentioned herein will be apparent from the following description to one of ordinary skill in the art to which the disclosure pertains.

In an embodiment, a memory system may include: a nonvolatile memory device including a plurality of memory blocks, each memory block including a plurality of pages; and a controller suitable for controlling the nonvolatile memory device to store user data received from a host in a first block among the memory blocks, to store metadata in a second block among the memory blocks, and to generate the metadata corresponding to storage of the user data, the controller may map a first logical address used in the host to a physical address of the first block, and may map a second logical address not used in the host, to a physical address of the second block, the first logical address and the second logical address being successive.

The controller may share a range of the first logical address with the host, may select the first block among the memory blocks in response to the first logical address received from the host, and may map the physical address of the selected first block to the first logical address.

The controller may set a range of the second logical address, which is not overlapped with and is successive to the range of the first logical address, and when the metadata is generated, the controller may select the second block among the memory blocks in response to the second logical address, and may map the physical address of the selected second block to the second logical address.

The controller may move valid data of a first source block corresponding to the first logical address, to a first target block corresponding to the first logical address, and may move valid data of a second source block corresponding to the second logical address, to a second target block corresponding to the second logical address.

The controller may set a reference logical address for identifying the first logical address and the second logical address, and the controller may select a pre-source block corresponding to a predetermined condition for a merge operation, among the memory blocks, may compare a logical address of the pre-source block with the reference logical address, and may identify the pre-source block as one of the first source block and the second source block depending on a comparison result.

When a free block among the memory blocks is selected as the pre-target block, the controller may identify the pre-target block as the first target block by mapping a physical address of the pre-target block to the first logical address, and the identify the pre-target block as the second target block by mapping a physical address of the pre-target block to the second logical address.

When an open block among the memory blocks is selected as the pre-target block, the controller may identify the pre-target block corresponding to the first logical address, as the first target block, and may identify the pre-target block corresponding to the second logical address, as the second target block, by comparing a logical address of the pre-target block with the reference logical address.

The controller may set a specific value greater than a maximum value of the range of the first logical address, as a minimum value of the range of the second logical address, and may set the specific value as a value of the reference logical address.

The controller may set a specific value less than a minimum value of the range of the first logical address, as a maximum value of the range of the second logical address, and may set the specific value as a value of the reference logical address.

When the predetermined condition is whether the number of valid pages is less than or equal to a reference number, the controller may select the pre-source block to perform garbage collection as the merge operation, when the predetermined condition is whether a read count is less than or equal to a first reference count, the controller may select the pre-source block to perform read reclaim as the merge operation, and when the predetermined condition is whether a program/erase cycle count is greater than or equal to a second reference count, the controller may select the pre-source block to perform wear levelling as the merge operation.

In an embodiment, a method for operating a memory system including a nonvolatile memory device including a plurality of memory blocks each memory block including a plurality of pages, the method may include: storing user data received from the host in a first block among the memory blocks, a physical address of the first block mapped to a first logical address used in a host; generating metadata corresponding to storage of the user data; and storing the metadata in a second block among the memory blocks, a physical address of the second block mapped to a second logical address not used in the host, the first logical address and the second logical address may be successive.

The storing of the user data may include: sharing a range of the first logical address with the host; and selecting the first block among the memory blocks in response to the first logical address received from the host, and mapping the physical address of the selected first block to the first logical address.

The storing of the metadata may include: setting a range of the second logical address which is not overlapped with and is successive to the range of the first logical address; and when the metadata is generated, selecting the second block among the memory blocks in response to the second logical address, and mapping the physical address of the selected second block to the second logical address.

The method may further include: selecting a source block and a target block among the memory blocks to perform a merge operation of moving valid data of the source block to the target block, the selecting of the source block and the target block may include: when a first source block corresponding to the first logical address is selected, selecting a first target block corresponding to the first logical address, and moving valid data of the first source block, to the first target block; and when a second source block corresponding to the second logical address is selected, selecting a second target block corresponding to the second logical address, and moving valid data of the second source block, to the second target block.

The selecting of the source block and the target block may include: setting a reference logical address for identifying the first logical address and the second logical address; selecting a pre-source block corresponding to a predetermined condition for the merge operation, among the memory blocks; comparing a logical address of the pre-source block selected in the pre-selecting act, with the reference logical address; and identifying the pre-source block as one of the first source block and the second source block depending on a comparison result.

When a free block among the memory blocks is selected as the pre-target block, the selecting of the source block and the target block may further include: identifying the pre-target block as the first target block by mapping a physical address of the pre-target block to the first logical address; and identifying the pre-target block as the second target block by mapping a physical address of the pre-target block to the second logical address.

When an open block among the memory blocks is selected as the pre-target block, the selecting of the source block and the target block may further include: comparing a logical address of the pre-target block with the reference logical address; identifying the pre-target block corresponding to the first logical address, as the first target block, based on the comparing result; and identifying the pre-target block corresponding to the second logical address, as the second target block, based on the comparing result.

The setting of the reference logical address may include setting a specific value greater than a maximum value of the range of the first logical address, as a minimum value of the range of the second logical address, and setting the specific value as a value of the reference logical address.

The setting of the reference logical address may include setting a specific value less than a minimum value of the range of the first logical address, as a maximum value of the range of the second logical address, and setting the specific value as a value of the reference logical address.

The selecting of the pre-source block may include: when the predetermined condition is whether the number of valid pages is less than or equal to a reference number, selecting the pre-source block to perform garbage collection as the merge operation; when the predetermined condition is whether a read count is less than or equal to a first reference count, selecting the pre-source block to perform read reclaim as the merge operation; and when the predetermined condition is whether a program/erase cycle count is greater than or equal to a second reference count, selecting the pre-source block to perform wear leveling as the merge operation.

In an embodiment, a memory system may include: a memory device including a plurality of memory blocks, the memory device including a first set of blocks and a second set of blocks; and a controller suitable for: receiving normal data and a first logical address associated with the normal data from a host; storing the normal data in a first block among the first set of blocks, the first block having a first physical address mapped to the first logical address; generating metadata on the normal data in a second block among the second set of blocks; storing the metadata in a second block among the second set of blocks, the second block having a second physical address mapped to a virtual logical address; and performing a garbage collection operation on the first set of blocks and the second set of blocks.

Effects of the apparatus and the operating method according to the embodiments of the disclosure are as follows.

In the memory system according to the embodiments of the disclosure, in order to reduce the overlap and complexity of FTL (flash translation layer) program codes when schemes for processing user data inputted from a hosting or computing device and metadata generated in the memory system according to storage of user data are different from each other, substantially the same scheme for processing different types of data is used such that the overlap and complexity of FTL program codes may be reduced and debugging may be easily implemented.

Also, in the memory system according to the embodiments of the disclosure, because a user block for storing user data inputted from a hosting or computing device is managed through a first logical address used in the hosting or computing device and a metablock for storing metadata generated in the memory system according to storage of user data is managed through a second logical address not used in the hosting or computing device, the operation of managing the user block and metablock in an integrated manner based on logical addresses may not exert any influence on the operation of the hosting or computing device.

Further, in the memory system according to the embodiments of the disclosure, since operations to be performed in the memory system do not need to be separately performed in different schemes depending on a type of data, not only is it easy to determine a margin for an operation to be performed in the memory system, but also efficiency in allocating and using resources in the memory system may be increased.

DETAILED DESCRIPTION

Figure 1:
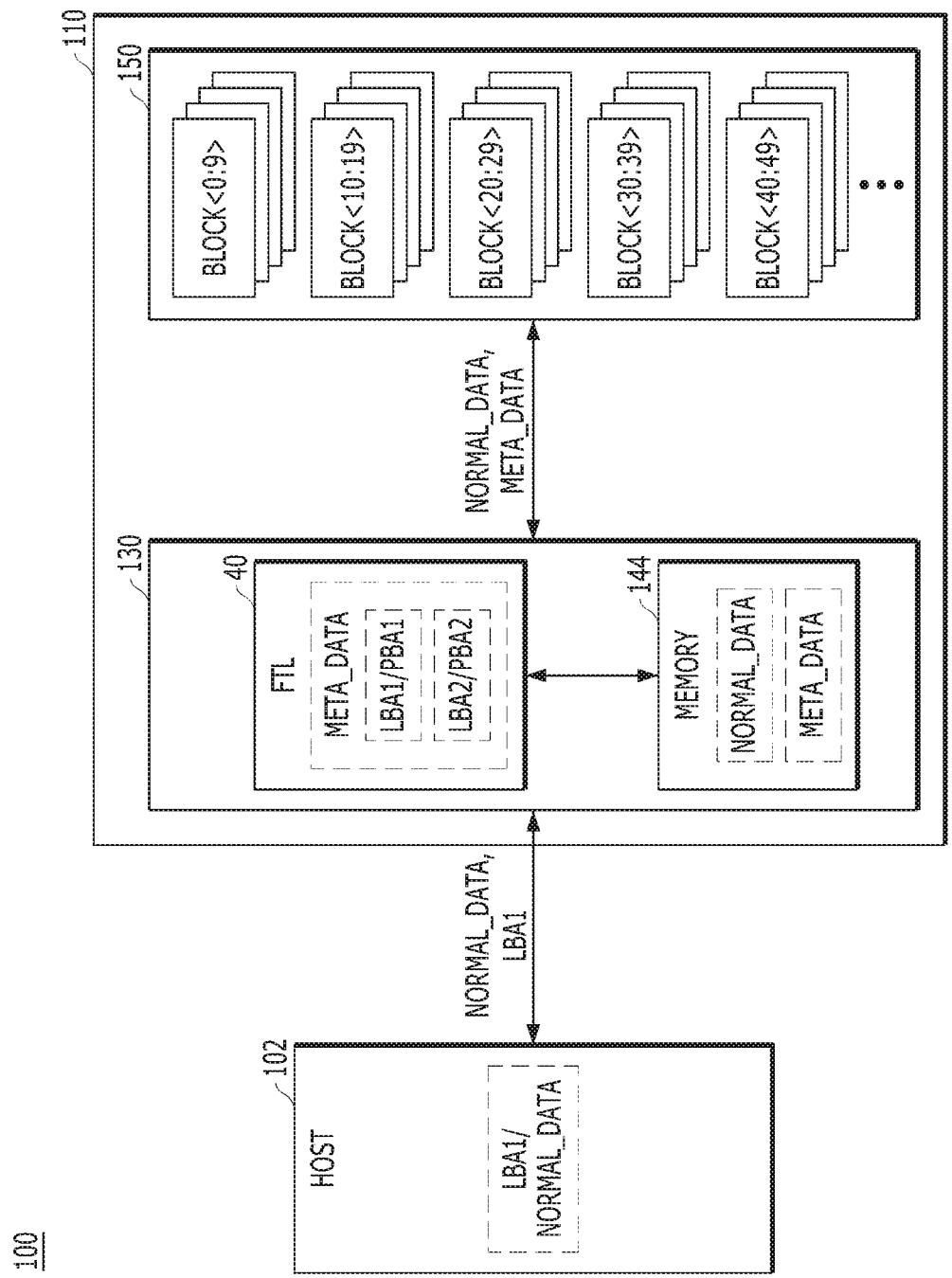
FIG. 1 is a diagram illustrating an operation of managing a user block and a metablock in an integrated manner in accordance with an embodiment of the disclosure.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It should be understood that the drawings are simplified schematic illustrations of the described devices and may not include well known details for avoiding obscuring the features of the invention.

It should also be noted that features present in one embodiment may be used with one or more features of another embodiment without departing from the scope of the invention.

FIG. 1 is a diagram illustrating an operation of managing a user block and a metablock in an integrated manner in accordance with an embodiment of the disclosure.

Referring to FIG. 1, a data processing system 100 may include a host 102 and a memory system 110, which may interoperate. The host 102 may be a computing device, which may be realized in the form of a mobile device, a computer, or a server. The memory system 110 may receive a command from the host 102 and may store or output data corresponding to the received command.

The memory system 110 may have a storage space which may include nonvolatile memory cells. For example, the memory system 110 may be realized in the form of a flash memory, or a solid-state drive (SSD).

In order to store data requested by the host 102, the memory system 110 may perform a mapping operation that couples a file system used by the host 102 with the storage space including the nonvolatile memory cells. An address of data according to the file system used by the host 102 may be referred to as a logical address or a logical block address. An address of data in the storage space including nonvolatile memory cells may be referred to as a physical address or a physical block address. When the host 102 transmits a logical address together with a write command and data to the memory system 110, the memory system 110 may search for a storage space for storing the data, may map a physical address of the searched storage space with the logical address, and may program the data in the searched storage space. When the host 102 transmits a logical address together with a read command to the memory system 110, the memory system 110 may search for a physical address mapped to the logical address, and may output data stored in the searched physical address, to the host 102.

The memory system 110 may include a controller 130 and a nonvolatile memory device 150. The nonvolatile memory device 150 may include a plurality of memory blocks including memory blocks BLOCK<0:9>, BLOCK<10:19>, BLOCK<20:29>, BLOCK<30:39>, and BLOCK<40:49>. The controller 130 may include a flash translation layer (FTL) component 40 and a memory 144.

The host 102 may manage user data NORMAL_DATA by using a first logical address LBA1. The controller 130 may use a first block among the memory blocks BLOCK<0:9> to BLOCK<40:49> in the memory device 150, to store the user data NORMAL_DATA received from the host 102. The controller 130 may map the first logical address LBA1 to a physical address PBA1 of the first block.

The controller 130 may generate metadata META_DATA corresponding to storage of the user data NORMAL_DATA. That is, the controller 130 may generate the metadata META_DATA corresponding to storing the user data NORMAL_DATA in the first block. The controller 130 may use a second block not overlapping with the first block, among the memory blocks BLOCK<0:9> to BLOCK<40:49>, to store the metadata META_DATA. The controller 130 may map a second logical address LBA2 not used in the host 102, to a physical address PBA2 of the second block.

An operation of generating metadata META_DATA by mapping the first logical address LBA1 to the physical address PBA1 of the first block and an operation of generating metadata META_DATA by mapping the second logical address LBA2 to the physical address PBA2 of the second block may be performed by the flash translation layer component 40. That is, an operation of generating metadata META_DATA by mapping logical addresses and physical addresses may be performed by the flash translation layer unit 40.

User data NORMAL_DATA transferred between the host 102 and the memory system 110 may be temporarily stored in the memory 144 of the controller 130, separately from being stored in the nonvolatile memory device 150. Metadata META_DATA may be generated by the controller 130 corresponding to storage of user data NORMAL_DATA from the host 102, and may be temporarily stored in the memory 144 of the controller 130, separately from being stored in the nonvolatile memory device 150.

The data size that can be stored in the memory system 110 is typically determined in advance in the course of manufacturing the memory system 110. For example, the data size that can be stored in the memory system 110 may be determined as 512 GByte or 1 TByte. The data size that can be stored in the memory system 110 may be shared with the host 102, for example, when the host 102 is coupled with the memory system 110. The host 102 may determine a range of the first logical address LBA1 depending on the storable data size of the memory system 110. The memory system 110 may share the range of the first logical address LBA1 with the host 102. Namely, the range of the first logical address LBA1 determined by the host 102 may be shared with the memory system 110, and the memory system 110 may determine a range of the second logical address LBA2 by referring to the range of the first logical address LBA1. The range of the second logical address LBA2 may not overlap with and be successive to the range of the first logical address LBA1. The host 102 may not be aware of whether or not the second logical address LBA2 is used in the memory system 110.

Which memory block is to be selected as the first block and which memory block is to be selected as a second block among the memory blocks BLOCK<0:9> to BLOCK<40:49> in the memory device 150 are not defined in advance. That is, the controller 130 may select any one block among the memory blocks BLOCK<0:9> to BLOCK<40:49> as the first block, and may select any other block among the memory blocks BLOCK<0:9> to BLOCK<40:49> as the second block.

This is because a time at which the controller 130 selects the first block among the memory blocks BLOCK<0:9> to BLOCK<40:49> may correspond to a time at which the user data NORMAL_DATA is received from the host 102 together with the first logical address LBA1. Similarly, a time at which the controller 130 selects the second block among the memory blocks BLOCK<0:9> to BLOCK<40:49> may correspond to a time at which the metadata META_DATA is generated by the controller 130.

The controller 130 may select at least one first block among the memory blocks BLOCK<0:9> to BLOCK<40:49> in response to the first logical address LBA1, which is inputted together with the user data NORMAL_DATA from the host 102. Further, the controller 130 may map the first logical address LBA1 to a physical address of the selected first block. Alternatively, a plurality of first blocks may be selected among the memory blocks BLOCK<0:9> to BLOCK<40:49> and may vary depending on a size of the user data NORMAL_DATA.

Further, when generating the metadata META_DATA, the controller 130 may determine the second logical address LBA2 corresponding to the metadata META_DATA, by referring to a range of the first logical address LBA1. The controller 130 may select at least one second block among the memory blocks BLOCK<0:9> to BLOCK<40:49> in response to the second logical address LBA2 corresponding to the metadata META_DATA. Further, the controller 130 may map the second logical address LBA2 corresponding to the metadata META_DATA, to a physical address of the selected second block. Depending on the size of the metadata META_DATA one or more second blocks may be selected among the memory blocks BLOCK<0:9> to BLOCK<40:49>.

Figure 2:
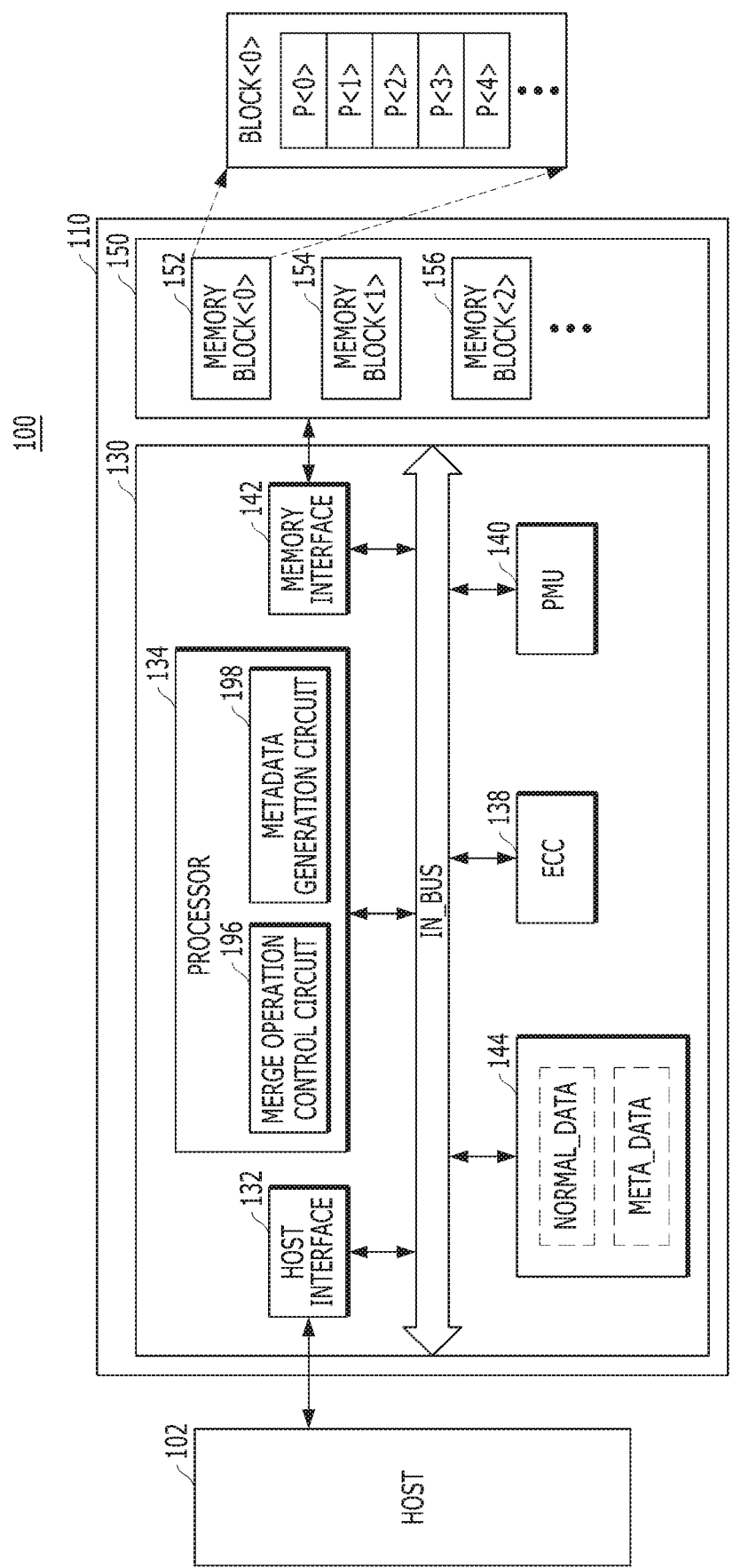
FIG. 2 is a diagram illustrating a data processing system including a memory system in accordance with an embodiment of the disclosure.

FIG. 2 is a diagram illustrating a data processing system 100 including a memory system 110 in accordance with an embodiment of the disclosure.

Referring to FIG. 2, the data processing system 100 may include a host 102 coupled to the memory system 110.

The host 102 may include an electronic device, for example, a portable electronic device such as a mobile phone, an MP3 player and a laptop computer or a non-portable electronic device such as a desktop computer, a game machine, a television (TV) and a projector, that is, wired and wireless electronic devices.

The host 102 may include at least one operating system (OS) for managing and controlling the function and operation of the host 102, and providing interoperability between the host 102 and a user using the data processing system 100 or the memory system 110. The operating system may support functions and operations corresponding to the user's purpose of use and the use of the operating system. For example, the operating system may be classified into a general operating system and a mobile operating system depending on the mobility of the host 102. Also, the general operating system may be classified into a personal operating system and an enterprise operating system depending on the user's usage environment. For example, the personal operating system characterized to support a service providing function for a general user may include Windows and Chrome, and the enterprise operating system characterized to secure and support high performance may include Windows server, Linux and Unix. In addition, the mobile operating system characterized to support a mobility service providing function and a system power saving function to users may include Android, iOS, Windows mobile, etc. The host 102 may include a plurality of operating systems, and may execute the operating systems to perform operations with the memory system 110 corresponding to a user request. The host 102 may transmit a plurality of commands corresponding to a user request to the memory system 110, and accordingly, the memory system 110 may perform operations corresponding to the commands, that is, operations corresponding to the user request.

The memory system 110 may operate in response to a request of the host 102, in particular, may store data to be accessed by the host 102. The memory system 110 may be used as a main memory device or an auxiliary memory device of the host 102. The memory system 110 may be realized as one of various types of storage devices, depending on a host interface protocol which is coupled with the host 102. For example, the memory system 110 may be realized as one of a solid-state drive (SSD), a multimedia card in the form of an MMC, an embedded MMC (eMMC), a reduced size MMC (RS-MMC) and a micro-MMC, a secure digital card in the form of an SD, a miniSD and a micro-SD, a universal serial bus (USB) storage device, a universal flash storage (UFS) device, a compact flash (CF) card, a smart media card, or a memory stick.

The storage devices which realize the memory system 110 may be realized by a volatile memory device such as a dynamic random access memory (DRAM) and a static random access memory (SRAM) or a nonvolatile memory device such as a read only memory (ROM), a mask ROM (MROM), a programmable ROM (PROM), an erasable programmable ROM (EPROM), an electrically erasable and programmable ROM (EEPROM), an ferroelectric random access memory (FRAM), a phase change RAM (PRAM), a magnetic RAM (MRAM) and/or a resistive RAM (RRAM).

The memory system 110 may include a memory device 150 which may store data to be accessed by the host 102, and a controller 130 which may control storage of data in the memory device 150.

The controller 130 and the memory device 150 may be integrated into one semiconductor device to configure an SSD. When the memory system 110 is used as an SSD, the operating speed of the host 102 which is coupled to the memory system 110 may be improved. In another embodiment, the controller 130 and the memory device 150 may be integrated into one semiconductor device to configure a memory card, such as a PC card (e.g., Personal Computer Memory Card International Association (PCMCIA) card), a compact flash card (CF), a smart media card (e.g., SM and SMC), a memory stick, a multimedia card (e.g., MMC, RS-MMC and MMCmicro), a secure digital (SD) card (e.g., SD, miniSD, microSD and SDHC) and/or a universal flash storage (UFS).

In another embodiment, the memory system 110 may configure a computer, an ultra mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, a radio frequency identification (RFID) device, or one of various component elements configuring a computing system.

The memory device 150 may retain stored data even though power is not supplied. In particular, the memory device 150 may store the data provided from the host 102, through a write operation, and provide stored data to the host 102, through a read operation. The memory device 150 may include a plurality of memory blocks 152, 154 and 156. Each of the memory blocks 152, 154 and 156 may include a plurality of pages including P<0> to P<4>. Each of the pages including P<0> to P<4> may include a plurality of memory cells. The memory blocks 152, 154 and 156 include page buffers for caching data to be inputted/outputted, by a unit of a page. The memory device 150 may include a plurality of planes in each of which some of the plurality of memory blocks 152, 154 and 156 are included. The memory device 150 may include a plurality of memory dies in each of which one or more of the plurality of planes are included. The memory device 150 may be a nonvolatile memory device, for example, a flash memory. The flash memory may have a three-dimensional (3D) stack structure.

The controller 130 may control the memory device 150 in response to a request from the host 102. For example, the controller 130 may provide the data read from the memory device 150, to the host 102, and may store the data provided from the host 102, in the memory device 150. To this end, the controller 130 may control the operations of the memory device 150, such as read, write, program, and erase operations.

The controller 130 may include a host interface 132, a processor 134, an error correction code (ECC) component 138, a power management unit (PMU) 140, a memory interface 142 and a memory 144.

The host interface 132 may process the commands and data of the host 102. The host interface 132 may be configured to communicate with the host 102 through at least one of various interface protocols, such as universal serial bus (USB), multimedia card (MMC), peripheral component interconnect-express (PCI-e or PCIe), serial attached SCSI (SAS), serial advanced technology attachment (SATA), parallel advanced technology attachment (DATA), small computer system interface (SCSI), enhanced small disk interface (ESDI), integrated drive electronics (IDE) and mobile industry processor interface (MIPI). The host interface 132 may be driven through a firmware referred to as a host interface layer (HIL) being a region which exchanges data with the host 102.

The ECC component 138 may detect and correct an error contained in the data read from the memory device 150. In other words, the ECC component 138 may perform an error correction decoding process on the data read from the memory device 150 using an ECC code used during an ECC encoding process. According to a result of the error correction decoding process, the ECC component 138 may output a signal, for example, an error correction success/fail signal. When the number of error bits is greater than a threshold value of correctable error bits, the ECC component 138 may not correct the error bits, and instead may output an error correction fail signal.

The ECC component 138 may perform error correction through a coded modulation such as low density parity check (LDDC) code, Bose-Chaudhri-Hocquenghem (BCH) code, turbo code, Reed-Solomon (RS) code, convolution code, recursive systematic code (RSC), trellis-coded modulation (TCM) and block coded modulation (BCM). However, the ECC component 138 is not limited to these correction techniques. As such, the ECC component 138 may include all circuits, modules, systems or devices for suitable error correction.

The PMU 140 may provide and manage the power of the controller 130.

The memory interface 142 may serve as a memory/storage interface which may perform interfacing between the controller 130 and the memory device 150. The memory interface 142 may allow the controller 130 to control the memory device 150 in response to a request from the host 102. The memory interface 142 may generate control signals for the memory device 150 and may process data under the control of the processor 134. The memory interface 142 may be a NAND flash controller (NFC) when the memory device 150 is a flash memory, in particular, when the memory device 150 is a NAND flash memory. The memory interface 142 may support the operation of an interface which may process a command and data between the controller 130 and the memory device 150, for example, a NAND flash interface. In particular, the memory interface 142 may process data input/output between the controller 130 and the memory device 150. The memory interface 142 may be driven through a firmware referred to as a flash interface layer (FIL) being a region which exchanges data with the memory device 150.

The memory 144, as the working memory of the memory system 110 and the controller 130, may store data for driving of the memory system 110 and the controller 130. The memory 144 may temporarily store user data NORMAL_DATA read from the memory device 150 during a process in which the controller 130 controls the memory device 150 in response to a request from the host 102, before providing the user data NORMAL_DATA to the host 102. Also, the controller 130 may temporarily store user data NORMAL_DATA provided from the host 102, in the memory 144, before storing the user data NORMAL_DATA in the memory device 150. When the controller 130 controls read, write, program, and erase operations of the memory device 150, data NORMAL_DATA and META_DATA to be transmitted or generated between the controller 130 and the memory device 150 in the memory system 110 may be stored in the memory 144. For example, the memory 144 may store metadata META_DATA necessary to perform data write and read operations between the host 102 and the memory device 150 and user data NORMAL_DATA when performing the data write and read operations. In order for such data storage, the memory 144 may include a program memory, a data memory, a write buffer/cache, a read buffer/cache, a data buffer/cache, and a map buffer/cache.

The memory 144 may be realized by a volatile memory. For example, the memory 144 may be realized by a static random-access memory (SRAM) or a dynamic random-access memory (DRAM). The memory 144 may exist inside the controller 130 as illustrated in the drawing. Alternatively, the memory 144 may exist outside the controller 130 unlike the illustration of the drawing. The memory 144 may be realized as an external volatile memory to and from which data is inputted and outputted from and to the controller 130 through a separate memory interface.

The processor 134 may control the entire operations of the memory system 110. In particular, the processor 134 may control a program operation or a read operation for the memory device 150, in response to a write request or a read request from the host 102. The processor 134 may drive firmware which is referred to as a flash translation layer (FTL), to control general operations of the memory system 110. The processor 134 may be realized by a microprocessor or a central processing unit (CPU).

For instance, the controller 130 may perform an operation requested from the host 102, in the memory device 150. That is, the controller 130 may perform a command operation corresponding to a command received from the host 102, with the memory device 150, through the processor 134. The controller 130 may perform a foreground operation as a command operation corresponding to a command received from the host 102. For example, the controller 130 may perform a program operation corresponding to a write command, a read operation corresponding to a read command, an erase operation corresponding to an erase command or a parameter set operation corresponding to a set parameter command or a set feature command as a set command.

The controller 130 may also perform a background operation for the memory device 150, through the processor 134. The background operation for the memory device 150 may include an operation of copying data stored in a memory block among the memory blocks 152, 154 and 156 of the memory device 150 to another memory block, for example, a garbage collection (GC) operation.

In order to control a garbage collection operation as a background operation for the memory device 150, a merge operation control circuit 196 may be included in the processor 134.

The background operation for the memory device 150 may include an operation of swapping the memory blocks 152, 154 and 156 of the memory device 150 or data stored in the memory blocks 152, 154 and 156, for example, a wear levelling (WL) operation and a read reclaim (RR) operation. Also, the background operation for the memory device 150 may include an operation of storing map data stored in the controller 130, in the memory blocks 152, 154 and 156 of the memory device 150, for example, a map flush operation, a bad block management operation for the memory device 150, or a bad block management operation of checking and processing a bad block among the plurality of memory blocks 152, 154 and 156 of the memory device 150.

Here, an operation of copying, swapping, moving or merging the memory blocks 152, 154 and 156 or data stored in the memory blocks 152, 154 and 156, such as a garbage collection operation, a wear levelling operation and a read reclaim operation, may be defined as a merge operation. The merge operation control circuit 196 for controlling the merge operation may be included in the processor 134 of the controller 130.

In the processor 134, a management component (not illustrated) for performing bad block management for the memory device 150 may be included. The management component may check a bad block among the plurality of memory blocks 152, 154 and 156 in the memory device 150, and then, may perform a bad block management of processing the checked bad block as a bad block. When the memory device 150 is a flash memory (for example, a NAND flash memory), a program failure may occur when performing a write operation (program operation), due to the characteristic of the NAND flash memory. The management component may process, as a bad block, a memory block in which the program failure has occurred and may write program-failed data in a new memory block.

A program operation, a read operation, and an erase operation of the controller 130 will be described below.

First, the controller 130 may store program data NORMAL_DATA corresponding to a program command received from the host 102, in a buffer/cache in the memory 144. Then, the controller 130 may store the data NORMAL_DATA stored in the buffer/cache, in the memory blocks 152, 154 and 156 in the memory device 150. That is, when a write command is received from the host 102, the controller 130 may perform a program operation corresponding to the write command. At this time, the controller 130 may store the data NORMAL_DATA corresponding to the write command, in at least one among the memory blocks 152, 154 and 156 of the memory device 150 (for example, empty memory blocks, open memory blocks or free memory blocks for which an erase operation is performed, among memory blocks). Also, the controller 130 may update map data META_DATA corresponding to the program operation to the memory device 150. Then, the controller 130 may store the updated map data META_DATA in the memory blocks 152, 154 and 156 in the memory device 150. That is, the controller 130 may store logical/physical (logical-to-physical, L2P) address information (or an L2P map) and physical/logical (physical-to-logical, P2L) address information (or a P2L map) on the user data NORMAL_DATA stored in memory blocks, in empty memory blocks, open memory blocks or free memory blocks among the memory blocks of the memory device 150, in the form of a map table or a map list.

When a read command is received from the host 102, the controller 130 may read data NORMAL_DATA corresponding to the read command, from the memory device 150, by checking map data META_DATA of the data NORMAL_DATA corresponding to the read command. Further, the controller 130 may store the read data NORMAL_DATA in the buffer/cache in the memory 144 of the controller 130, and then, may provide the data NORMAL_DATA stored in the buffer/cache, to the host 102.

When an erase command is received from the host 102, the controller 130 may perform an erase operation of checking a memory block corresponding to the erase command, erasing data stored in the checked memory block. Further, the erase operation may include updating map data META_DATA corresponding to the erased data and then storing the updated map data META_DATA in the memory blocks 152, 154 and 156 included in the memory device 150.

In map data, there may be logical/physical (logical to physical, L2P) information and physical/logical (physical to logical, P2L) information on data stored in memory blocks corresponding to a program operation.

Data corresponding to a command may include user data NORMAL_DATA and metadata META_DATA generated by the controller 130 corresponding to storage of the user data NORMAL_DATA. The metadata META_DATA may include map data generated by the controller 130 corresponding to that the user data NORMAL_DATA which is stored in the memory device 150. Also, the metadata META_ DATA may include information on command data NORMAL_DATA corresponding to a command received from the host 102, information on a command operation corresponding to the command, information on memory blocks of the memory device 150 for which the command operation is to be performed, and information on map data corresponding to the command operation. In other words, the metadata META_DATA may include information and data for the command operation, except the user data NORMAL_DATA corresponding to the command received from the host 102. As described above, the metadata META_DATA may be generated by the controller 130. A metadata generation circuit 198 for generating the metadata META_DATA may be included in the processor 134 of the controller 130.

User data NORMAL_DATA to be stored in the memory device 150 may be divided in the unit of segment having a predetermined size. The predetermined size may be the same as a minimum data size required for the memory system 110 to interoperate with the host 102. According to an embodiment, a size of a data segment as the unit of user data NORMAL_DATA may be determined corresponding to a configuration and a control method in the memory device 150. While storing data segments of user data NORMAL_DATA in the memory blocks of the memory device 150, the controller 130 may generate or update map addresses corresponding to the stored data segments. When meta segments each as the unit of metadata META_DATA including a map address (for example, logical/physical (L2P) segments and physical/logical (P2L) segments as map segments of map data) are generated by the controller 130 or map segments stored in memory blocks are loaded to the memory 144 and are then updated, the map segments may be stored in the memory blocks of the memory device 150.

Figure 3:
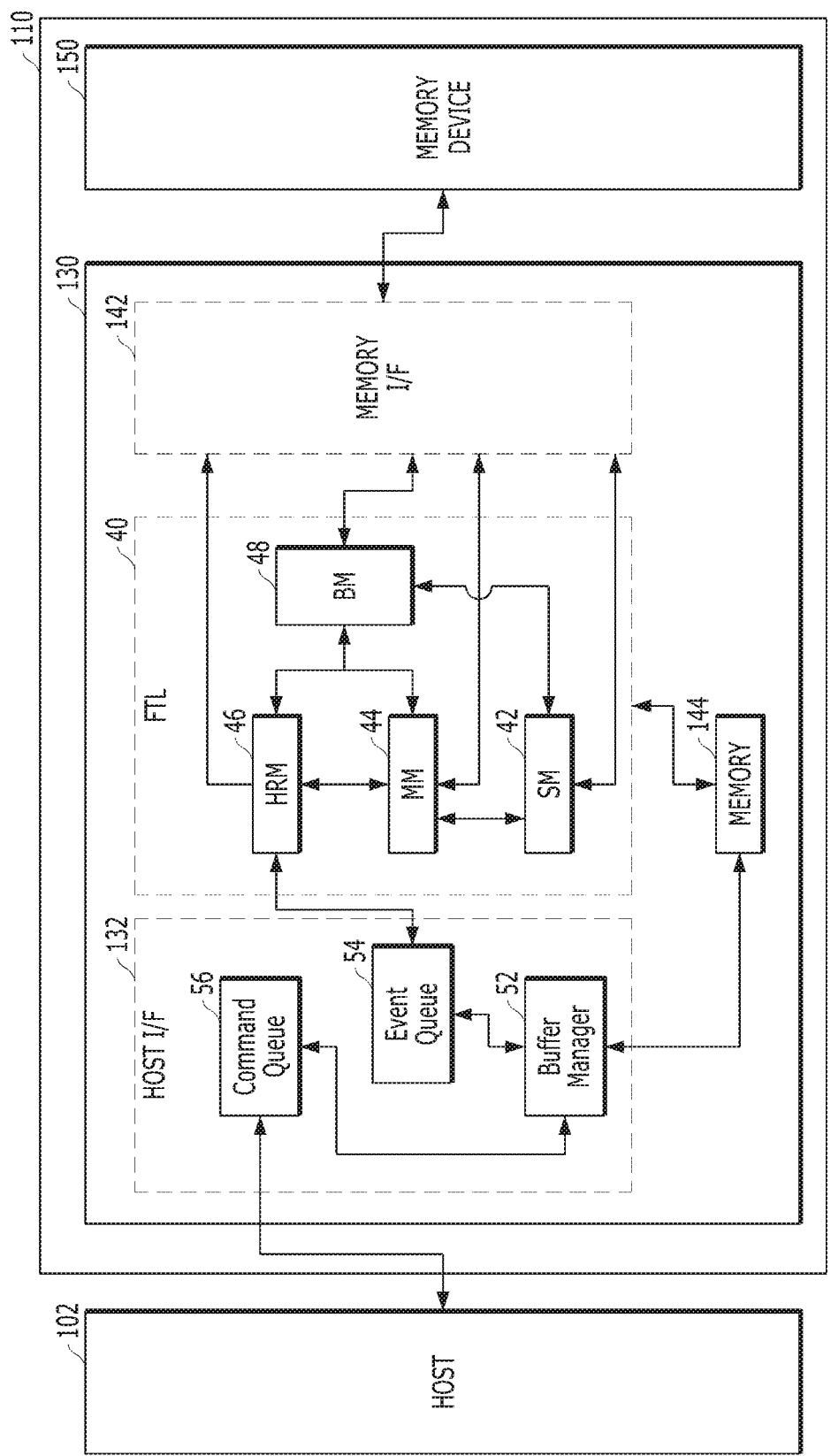
FIG. 3 is a diagram illustrating a controller in a memory system in accordance with the embodiment of the disclosure.

FIG. 3 is a diagram illustrating a controller 130 in a memory system in accordance with the embodiment of the disclosure.

While not illustrated in FIG. 3, the ECC component 138 of FIG. 2 may be included in the flash translation layer (FTL) component 40. According to an embodiment, the ECC component 138 may be realized by a separate module, circuit or firmware in the controller 130.

Referring to FIG. 3, the host interface (I/F) 132 may manage commands and data, which are received from the host 102. By way of example but not limitation, the host interface 132 may include a buffer manager 52, an event queue 54, and a command queue 56. The command queue 56 may sequentially store the commands and the data, and output the commands and the data to the buffer manager 52 in an order in which the commands and the data are stored in the command queue 56. The buffer manager 52 may classify, manage or adjust the commands and the data, which are delivered from the command queue 56. The event queue 54 may sequentially transmit events for processing the commands and the data, which are received from the buffer manager 52.

The memory system 110 may receive a plurality of commands and/or data having the same characteristic, or a plurality of commands and/or data having different characteristics after being mixed or jumbled. For example, the memory system 110 receives a plurality of commands for reading data (i.e., read commands), or alternatively receives a plurality of commands for reading data (i.e., read commands) and programming data (i.e., write commands). The host interface 132 may store commands and data, which are received from the host 102, to the command queue 56 sequentially. Thereafter, the host interface 132 may estimate or predict what type of operation the controller 130 will perform according to the characteristics of the command and data. The host interface 132 may determine a processing order and a priority of commands and data, based on their characteristics. According to characteristics of the commands and data, the buffer manager 52 may determine storing of the commands and the data in the memory 144, or delivering the commands and the data into the flash translation layer 40. The event queue 54 receives events, entered from the buffer manager 52, which are to be internally executed and processed by the memory system 110 or the controller 130 in response to the commands and the data, to deliver the events into the flash translation layer 40 in the order received.

In an embodiment, the flash translation layer component 40 may include a state manager (SM) 42, a map manager (MM) 44, a host request manager (HRM) 46, and a block manager (BM) 48. The host request manager 46 may manage the events entered from the event queue 54. The map manager 44 may handle or control map data. The state manager 42 may perform a merge operation such as garbage collection (GC), wear levelling (WL) or read reclaim (RR). The block manager 48 may execute commands or instructions onto a block in the memory device 150.

By way of example but not limitation, the host request manager 46 may use the map manager 44 and the block manager 48 to handle or process requests according to the read and program commands, and events which are delivered from the host interface 132. The host request manager 46 may send an inquiry request to the map data manager 44, to determine a physical address corresponding to a logical address which is entered with the events. The host request manager 46 may transmit a read request with the physical address to the memory interface (I/F) 142, to process the read request (or handle the events). On the other hand, the host request manager 46 may transmit a program request (or write request) to the block manager 48, to program data to a specific free page (i.e., a page having no data) in the memory device 150. Further, the host request manager 46 may transmit a map update request corresponding to the program request to the map manager 44, to update an item relevant to the programmed data in mapping information. The mapping information may indicate a mapping relationship between logical addresses and physical addresses.

The block manager 48 may convert a program request, which is delivered from the host request manager 46, the map data manager 44, and/or the state manager 42, into a flash program request used for the memory device 150, to manage flash blocks in the memory device 150. In order to maximize or enhance program or write performance of the memory system 110, the block manager 48 may collect program requests and send flash program requests for multiple-plane and one-shot program operations to the memory interface 142. The block manager 48 may send several flash program requests to the memory interface 142 to enhance or maximize parallel processing of a multi-channel and multi-directional flash controller.

The block manager 48 may manage blocks of the memory device 150 according to the number of valid pages. Further, the block manager 48 may select and erase blocks having no valid pages when a free block is needed. Furthermore, the block manager 48 may select a block including the least or lowest number of valid pages when it is determined that garbage collection is necessary. The state manager 42 may perform garbage collection to move the valid data to an empty block and erase the blocks that used to contain the valid data so that the block manager 48 may have enough free blocks (i.e., empty blocks with no data). If the block manager 48 may provide information regarding a block to be erased to the state manager 42, the state manager 42 may check all flash pages of the block to be erased to determine whether each page is valid. For example, to determine validity of each page, the state manager 42 may identify a logical address stored in an out-of-band (OOB) area of each page. To determine whether each page is valid, the state manager 42 may compare the physical address of the page with the physical address mapped to the logical address obtained from the inquiry request. The state manager 42 sends a program request to the block manager 48 for each valid page. A mapping table may be updated through the update of the map manager 44 when the program operation is completed.

The map manager 44 may manage a logical-to-physical mapping table. The map manager 44 may process requests such as queries and updates, which are generated by the host request manager 46 or the state manager 42. The map manager 44 may store the entire mapping table in the memory device 150 and cache mapping entries according to the storage capacity of the memory 144. When a map cache miss occurs while processing inquiry or update requests, the map manager 44 may send a read request to the memory interface 142 to load a relevant mapping table stored in the memory device 150. When the number of dirty cache blocks exceeds a certain threshold, the map manager 44 may transmit a program request to the block manager 48 so that a clean cache block is made as well as the dirty mapping table may be stored in the memory device 150.

When garbage collection is performed, the state manager 42 copies valid page(s) into a free block, and the host request manager 46 may program the latest version of the data for the same logical address of the page and currently issue an update request. When the state manager 42 requests the map update in a state in which copying of valid page(s) is not completed normally, the map manager 44 may not perform a map update (i.e., an update of the mapping table). This is because the map request is issued with old physical information if the state manger 42 requests a map update and a valid page copy is completed later. The map manager 44 may perform a map update to ensure accuracy only if the latest map table still points to the old physical address.

In an embodiment, at least one of the block manager 48, the map manager 44, and the state manager 42 may include the merge operation control circuit 196 and the metadata generation circuit 198 described above in FIGS. 1-2 and later in FIG. 6.

The memory device 150 may include a plurality of memory blocks. Each of the plurality of memory blocks may be implemented as any of various types, such as a single level cell (SLC) memory block and a multi level cell (MLC) memory block, according to the number of bits that can be stored or represented in one memory cell of that memory block. The SLC memory block may include a plurality of pages implemented by memory cells, each storing one bit of data. The SLC memory block may have high performance for data input and output (I/O) operations and high durability. The MLC memory block may include a plurality of pages implemented by memory cells, each storing multi-bit data (e.g., two bits or more). The MLC memory block may have larger storage capacity in the same space than the SLC memory block. The MLC memory block may be highly integrated in terms of storage capacity. In an embodiment, the memory device 150 may be implemented with MLC memory blocks such as an MLC memory block, a triple level cell (TLC) memory block, a quadruple level cell (QLC) memory block and a combination thereof. The MLC memory block may include a plurality of pages implemented by memory cells, each capable of storing 2-bit data. The triple level cell memory block may include a plurality of pages implemented by memory cells, each capable of storing 3-bit data. The quadruple level cell memory block may include a plurality of pages implemented by memory cells, each capable of storing 4-bit data. In another embodiment, the memory device 150 may be implemented with a block including a plurality of pages implemented by memory cells, each capable of storing 5-bit data or more.

In an embodiment, the memory device 150 is embodied as a nonvolatile memory, for example, a flash memory, such as a NAND flash memory and a NOR flash memory. However, the memory device 150 may be implemented by at least one of a phase change random access memory (PCRAM), a ferroelectrics random access memory (FRAM) and a spin transfer torque magnetic random-access memory (STT-RAM or STT-MRAM).

Figure 4:
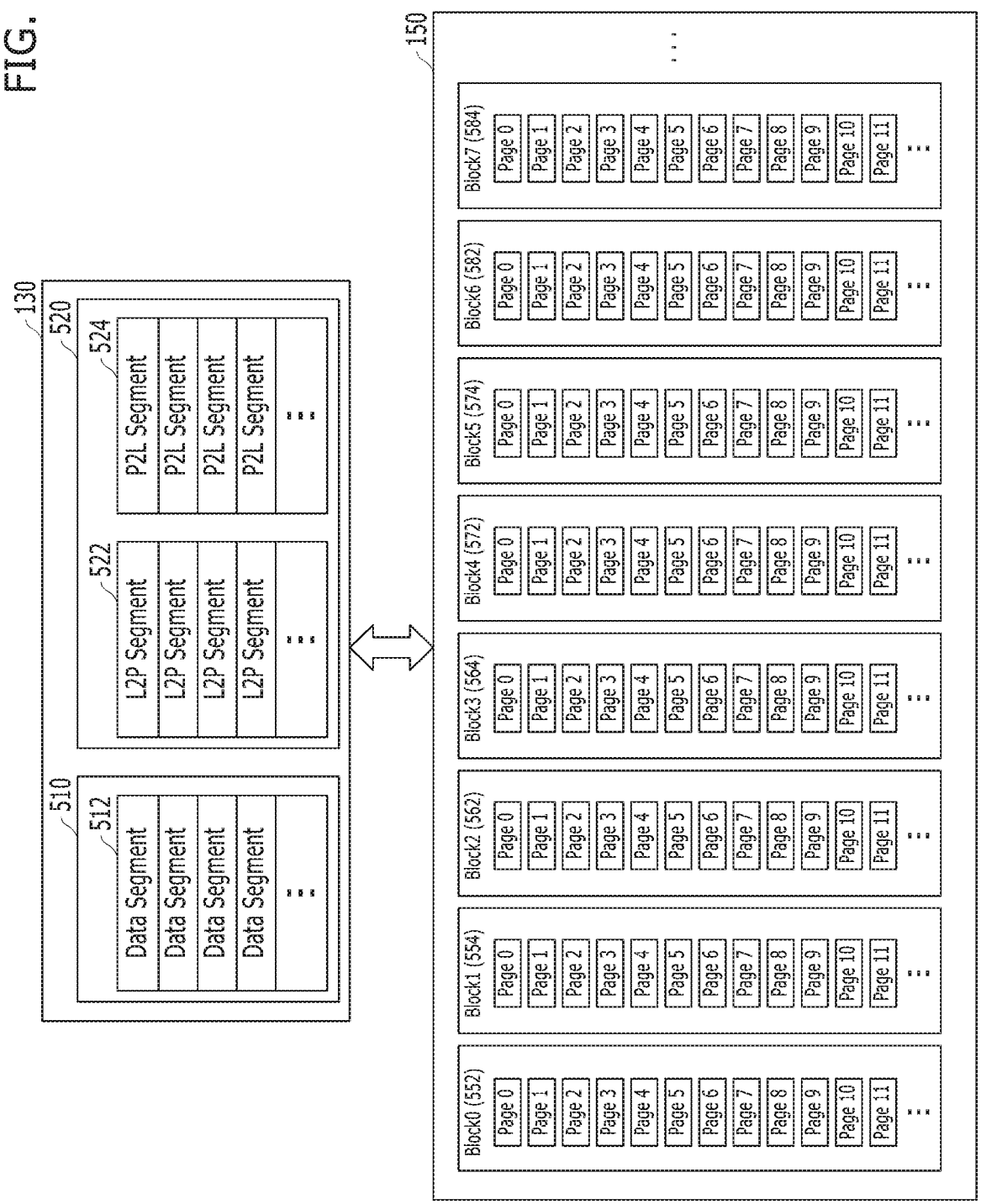
FIG. 4 is a diagram illustrating a data processing operation to be performed for a memory device in the memory system in accordance with the embodiment of the disclosure.

FIG. 4 is a diagram illustrating a data processing operation with respect to a memory device in a memory system in accordance with an embodiment.

Referring to FIG. 4, the controller 130 may receive a program command, program data and logical addresses from the host 102. The controller 130 programs and may store the program data in the plurality of pages in memory blocks 552 to 584 of the memory device 150, in response to the program command.

The controller 130 may generate and updates metadata for the program data, and programs and may store the metadata in the memory blocks 552 to 584 of the memory device 150. The metadata may include logical/physical (L2P) information and physical/logical (P2L) information for the program data stored in the memory blocks 552 to 584. Also, the metadata may include information on command data corresponding to a command received from the host 102, information on a command operation corresponding to the command, information on the memory blocks of the memory device 150 for which the command operation is to be performed, and information on map data corresponding to the command operation. In other words, metadata may include all remaining information and data except program data corresponding to a command received from the host 102.

The logical/physical (L2P) information and the physical/logical (P2L) information mean information in which physical addresses corresponding to the logical addresses are mapped by the controller 130 in response to the program command. The physical addresses may be addresses corresponding to physical storage spaces of the memory device 150 where the program data received from the host 102 are to be stored.

The controller 130 may store the mapping information between the logical addresses and the physical addresses, that is, the logical/physical (L2P) information and the physical/logical (P2L) information, in at least one memory block among the memory blocks 552 to 584 of the memory device 150. The at least one memory block which may store the logical/physical (L2P) information and the physical/logical (P2L) information may be referred to as a system block.

For example, the controller 130 caches and buffers the program data corresponding to the program command, in a first buffer 510 in the memory 144 of the controller 130. That is, the controller 130 may store data segments 512 of user data in the first buffer 510 as a data buffer/cache. Thereafter, the controller 130 programs and may store the data segments 512 stored in the first buffer 510, in the pages in the memory blocks 552 to 584 of the memory device 150.

As the data segments 512 of the program data are programmed and stored in the pages in the memory blocks 552 to 584 of the memory device 150, the controller 130 may generate L2P segments 522 and P2L segments 524 as metadata, and may store them in a second buffer 520 in the memory 144 of the controller 130. In the second buffer 520 of the memory 144 of the controller 130, the L2P segments 522 and the P2L segments 524 may be stored in the form of a list. Then, the controller 130 may program and store the L2P segments 522 and the P2L segments 524 stored in the second buffer 520, in the pages in the memory blocks 552 to 584 of the memory device 150, through a map flush operation.

The controller 130 may receive a read command and logical addresses from the host 102. The controller 130 may read L2P segments 522 and P2L segments 524 corresponding to the logical addresses from the memory device 150 and load them in the second buffer 520, in response to the read command. Then, the controller 130 checks physical addresses of the memory device 150 corresponding to the logical addresses from the L2P segments 522 and the P2L segments 524 loaded in the second buffer 520, reads data segments 512 of user data from storage positions known through the checking, that is, specific pages of specific memory blocks among the memory blocks 552 to 584, may store the data segments 512 in the first buffer 510, and may provide the data segments 512 to the host 102.

As described above, each time a read command and logical addresses are received from the host 102, the controller 130 may read L2P segments 522 and P2L segments 524 corresponding to the logical addresses, and load them in the second buffer 520. Frequent repetition of the operation of loading L2P segments 522 and P2L segments 524 in this way may cause the performance degradation of the read operation.

As the controller 130 may load a greater amount of L2P segments 522 and P2L segments 524 from the memory device 150 at a time, a single operation of loading L2P segments 522 and P2L segments 524 may deal with the greater number of read commands. Therefore, read performance of the memory system 110 may be improved.

L2P segments may be optimized to search for physical addresses corresponding to specific logical addresses. As a result, L2P segments may be efficient in searching for physical addresses to be mapped to logical addresses inputted from the host 102, in a read operation.

P2L segments 524 may be optimized for a program operation. The controller 130 may need to quickly allocate storage spaces in the memory device 150 for storing program data, when receiving a program command, program data and logical addresses from the host 102. In this regard, the controller 130 may load in advance a list of available physical addresses in the second buffer 520. Therefore, at a time when the program command, the program data and the logical addresses are received from the host 102, the controller 130 may quickly search the list of available physical addresses loaded in the second buffer 520. Further, the controller 130 may map physical addresses for the program data, with the logical addresses, and may then store the program data in the storage spaces corresponding to the physical addresses. At this time, P2L segments 524 may be generated and be temporarily stored in the second buffer 520. The P2L segments 524 stored in the second buffer 520 may be stored in the memory device 150 through a map flush operation.

Figures 5, 6:
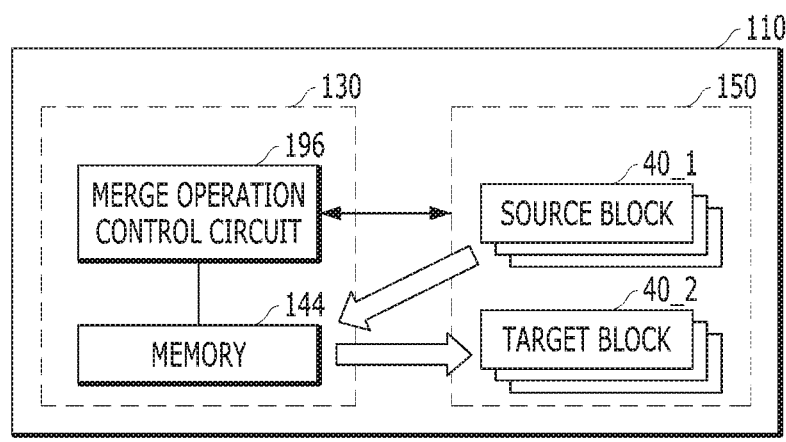
FIG. 5 is a diagram illustrating an operation of managing a user block and a metablock in an integrated manner based on logical addresses in accordance with the embodiment of the disclosure.
FIG. 6 is a diagram illustrating a merge operation of a memory system in accordance with the embodiment of the disclosure.

FIG. 5 is a diagram illustrating an operation of managing a user block and a metablock in an integrated manner based on logical addresses in accordance with the embodiment of the disclosure.

Referring to FIGS. 1 to 5, the controller 130 of the memory system 110 may use a first block 1ST_BLOCK among the memory blocks BLOCK<0:9> to BLOCK<40:49> in the memory device 150, to store user data NORMAL_DATA inputted from the host 102. The controller 130 may map a first logical address LBA1 to a physical address PBA1 of the first block 1ST_BLOCK.

The controller 130 may use a second block 2ND_BLOCK not overlapping with the first block 1ST_BLOCK among the memory blocks BLOCK<0:9> to BLOCK<40:49> to store metadata META_DATA. The controller 130 may map a second logical address LBA2 not used in the host 102, to a physical address PBA2 of the second block 2ND_BLOCK.

The memory system 110 may share a range of the first logical address LBA1 with the host 102. Namely, the range of the first logical address LBA1 determined by the host 102 may be shared with the memory system 110, and the memory system 110 may determine a range of the second logical address LBA2 by referring to the range of the first logical address LBA1. The range of the second logical address LBA2 may not overlap with the range of the first logical address LBA1. The host 102 may not be aware of whether or not the second logical address LBA2 is used in the memory system 110.

Referring to FIG. 5, the range of the first logical address LBA1 may be set to 0x00000000 to 0x01DC1800. The range of the second logical address LBA2 may be set to 0x02000000 to 0x02020000. That is, the range of the first logical address LBA1 and the range of the second logical address LBA2 may be set not to overlap with each other.

The controller 130 may set a reference logical address value to distinguish the first logical address LBA1 and the second logical address LBA2. For example, when the range of the first logical address LBA1 is less than the range of the second logical address LBA2, the controller 130 may set a specific value greater than a maximum value of the range of the first logical address LBA1, as a minimum value of the range of the second logical address LBA2, and may set the specific value as the reference logical address value. For example, the reference logical address value may be set to 0x02000000, a logical address which has a value greater than or equal to 0x02000000 as the reference logical address value may be the second logical address LBA2, and a logical address which has a value less than 0x02000000 as the reference logical address value may be the first logical address LBA1. Alternatively, the range of the first logical address LBA1 may be greater than the range of the second logical address LBA2. In this case, the controller 130 may set a specific value less than a minimum value of the range of the first logical address LBA1, as a maximum value of the range of the second logical address LBA2, and may set the specific value as the reference logical address value.

The first block 1ST_BLOCK may include a boot block for storing boot data, a user block for storing user data, a replay protected memory block (RPMB) for storing security data and an enhanced block for storing enhanced data. The second block 2ND_BLOCK may include a map block for storing map data, a history block for storing history data and a block state table (BST) for storing block state information.

FIG. 6 is a diagram illustrating a merge operation of a memory system in accordance with the embodiment of the disclosure.

Referring to FIG. 6, the merge operation may be self-performed by the memory system 110 without a command received from the host 102. Alternatively, the merge operation may be performed in the memory system 110 in response to a merge operation command (not illustrated) received from the host 102. The controller 130 of the memory system 110 may read data from at least one source block 40_1 of the memory device 150, and may store the data in the memory 144 of the controller 130. Further, the controller 130 may program the data in at least one target block 40_2 in the memory device 150. The at least one source block 40_1 may include a block in which data cannot be programmed any more. In an embodiment, the memory 144 may be disposed outside the controller 130 and interoperate with the controller 130.

The merge operation control circuit 196 of the controller 130 may self-start to perform a merge operation by checking the status of the memory device 150 or may perform a merge operation in response to a merge operation command received from the host 102.

A merge operation performed through the merge operation control circuit 196 will be described hereunder in detail.

The merge operation control circuit 196 may select at least one among a plurality of memory blocks in the memory device 150, as the source block 40_1. Also, the merge operation control circuit 196 may select at least one among the plurality of memory blocks in the memory device 150, as the target block 40_2. The merge operation control circuit 196 may search for and extract valid data in the source block 40_1, and may move the valid data to the target block 40_2. Data which is determined not to be valid any more in the source block 40_1 may be discarded (that is, may not be moved to the target block 40_2). If the valid data stored in the source block 40_1 is moved to the target block 40_2, the controller 130 does not regard any more that the specific source block 40_1 has valid data. Thereafter, if there is a need to program new data in the source block 40_1, all data stored in the source block 40_1 may be erased.

In an embodiment, the controller 130 may use the memory is 144 to temporarily store the valid data selected during the merge operation until it is programmed in the target block 40_2.

Referring to FIGS. 1 to 6, the plurality of memory blocks BLOCK<0:9> to BLOCK<40:49> in the memory device 150 may be divided into the first block 1ST_BLOCK corresponding to the first logical address LBA1 and the second block 2ND_BLOCK corresponding to the second logical address LBA2.

The controller 130 may store the user data NORMAL_DATA in the first block 1ST_BLOCK and may store the metadata META_DATA in the second block 2ND_BLOCK.

In an embodiment, when a pre-source block selected for the merge operation among memory blocks corresponds to the first logical address LBA1, the merge operation control circuit 196 of the controller 130 may identify the pre-source block as a first source block. The merge operation control circuit 196 may collect valid data of at least one first source block, and may move the collected valid data to at least one first target block corresponding to the first logical address LBA1. In other words, the merge operation control circuit 196 may cause the merge operation of moving the user data NORMAL_DATA between the first source block and the first target block corresponding to the first logical address LBA1, to be performed. When a pre-source block which is selected for the merge operation among memory blocks corresponds to the second logical address LBA2, the merge operation control circuit 196 may identify the pre-source block as a second source block. The merge operation control circuit 196 may collect valid data of the second source block, and may move the collected valid data to the second target block corresponding to the second logical address LBA2. In other words, the merge operation control circuit 196 may cause the merge operation of moving the metadata META_DATA between the second source block and the second target block corresponding to the second logical address LBA2, to be performed.

In each of memory blocks, data may be sequentially programmed from a first page to a last page. If data is programmed in none of the pages of a corresponding block, the corresponding block is a free block. A physical address of the free block may not be mapped to any logical address. If at least one data is programmed in a corresponding block and new data may be additionally programmed in the corresponding block, the corresponding block is an open block. A physical address of the open block may be mapped to a specific logical address. If data is programmed in a last page of a corresponding block and new data cannot be programmed any more in the corresponding block, the corresponding block may be a closed block. A physical address of the closed block may be mapped to a specific logical address.

In an embodiment, the merge operation control circuit 196 may select a source block 40_1 corresponding to a predetermined condition among closed blocks and open blocks among memory blocks, as a pre-source block. Further, the merge operation control circuit 196 may identify the pre-source block as a first source block when the pre-source block corresponds to the first logical address LBA1 or identify the pre-source block as a second source block when the pre-source block corresponds to the second logical address LBA2.

The merge operation control circuit 196 may select a target block 40_2 among open blocks and free blocks among memory blocks, as a pre-target block. In detail, when a free block which is not mapped to a logical address is selected as a pre-target block, the merge operation control circuit 196 may identify the pre-target block as a first target block by matching a logical address of the pre-target block to the first logical address LBA1 or may identify the pre-target block as a second target block by matching a logical address of the pre-target block to the second logical address LBA2. When an open block which is mapped to a logical address is selected as a pre-target block, the merge operation control circuit 196 may identify the pre-target block as a first target block when the pre-target block corresponds to the first logical address LBA1 or may identify the pre-target block as a second target block when the pre-target block corresponds to the second logical address LBA2.

The merge operation may be any one operation among a garbage collection operation, a read reclaim operation and a wear levelling operation. The predetermined condition of the merge operation control circuit 196 may be changed depending on what operation the merge operation is. When the merge operation is the garbage collection operation, the merge operation control circuit 196 may select at least one source block 40_1 among memory blocks, by determining whether the number of valid pages is less than or equal to a reference number, as the predetermined condition. When the merge operation is the read reclaim operation, the merge operation control circuit 196 may select at least one source block 40_1 among memory blocks, by determining whether a read count is less than or equal to a reference count, as the predetermined condition. When the merge operation is the wear levelling operation, the merge operation control circuit 196 may select at least one source block 40_1 among memory blocks, by determining whether a program/erase cycle count is greater than or equal to a reference count, as the predetermined condition.

Figure 7:
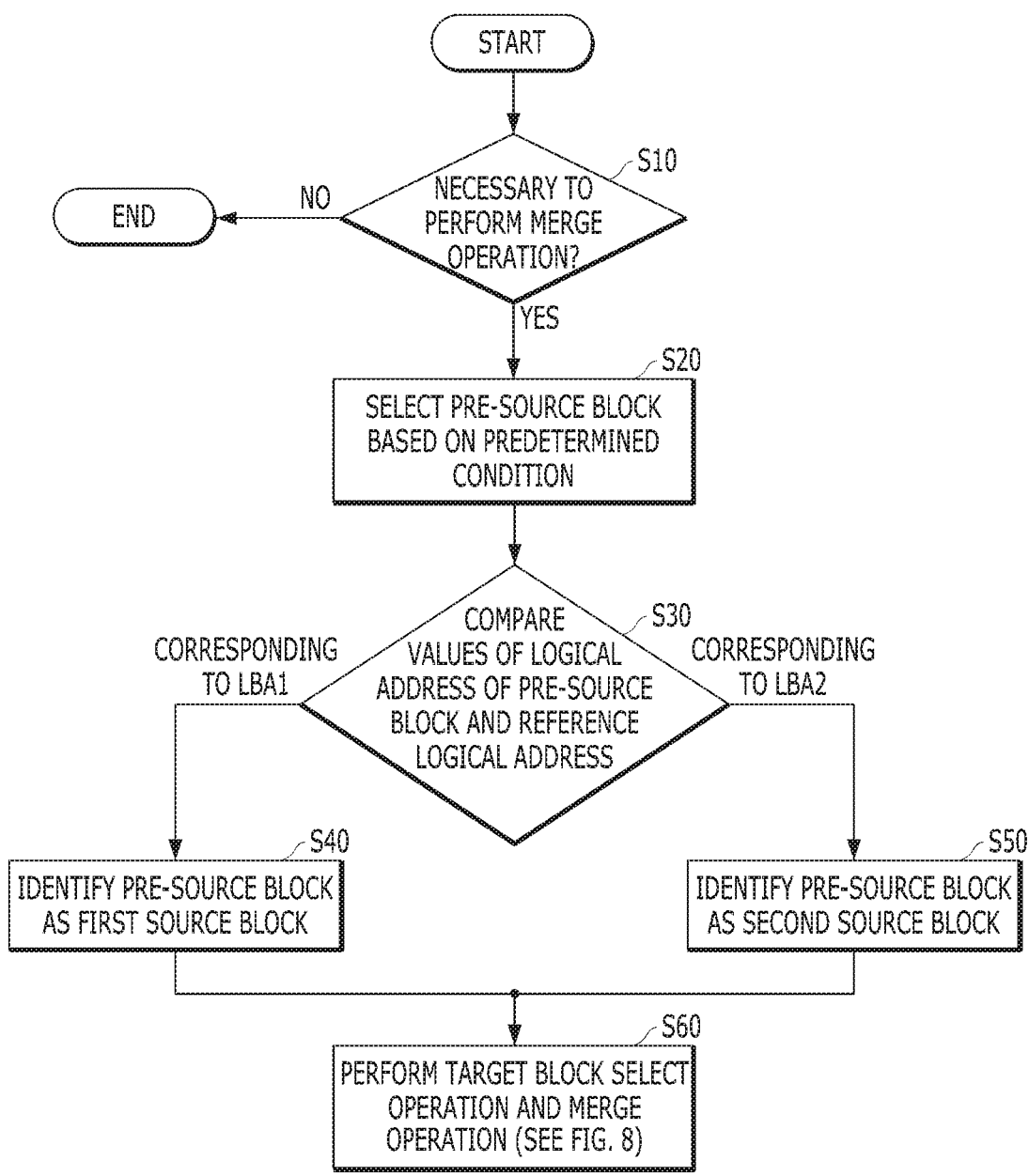
FIG. 7 is a flow chart illustrating a first operation of a merge operation performed in the memory system in accordance with the embodiment of the disclosure.

FIG. 7 is a flow chart illustrating a first operation of a merge operation performed in the memory system in accordance with the embodiment of the disclosure.

Referring to FIGS. 1 to 7, it may be seen how the controller 130 of the memory system 110 selects a source block for performing of a merge operation.

In FIG. 7, the controller 130 may check whether it is necessary to perform a merge operation (S10).

When it is not necessary to perform a merge operation (NO of the step S10), an operation of selecting a source block may not be performed.

When it is necessary to perform a merge operation (YES of the step S10), a block corresponding to a predetermined condition may be selected as a pre-source block among a plurality of memory blocks (S20). For example, when the merge operation is a garbage collection operation, a block in which the number of valid pages is less than or equal to or a reference number may be selected as the pre-source block among a plurality of memory blocks. When the merge operation is a read reclaim operation, a block of which a read count is less than or equal to a reference count may be selected as the pre-source block among a plurality of memory blocks. When the merge operation is a wear levelling operation, a block of which a program/erase cycle count is greater than or equal to a reference count may be selected as the pre-source block among a plurality of memory blocks.

After selecting a pre-source block among memory blocks, a value of a logical address LBA corresponding to the pre-source block may be compared with a value of a reference logical address (S30).

When it is checked that the pre-source block corresponds to the first logical address LBA1. (CORRESPONDING TO LBA1 OF S30), the pre-source block may be identified as a first source block (S40).

When the pre-source block is identified as a first source block, an operation of selecting a target block to move valid data of the first source block to the target block and a merge operation of moving the valid data of the first source block to the selected target block may be performed (S60). The performing of the operation of selecting the target block and the merge operation will be described below with reference to FIG. 8.

When it is checked that the pre-source block corresponds to the second logical address LBA2 (CORRESPONDING TO LBA2 OF S30), the pre-source block may be identified as a second source block (S50).

When the pre-source block is identified as a second source block, an operation of selecting a target block to move valid data of the second source block to the target block and a merge operation of moving the valid data of the second source block to the selected target block may be performed (S60). The performing of the operation of selecting the target block and the merge operation will be described below with reference to FIG. 8.

Figure 8:
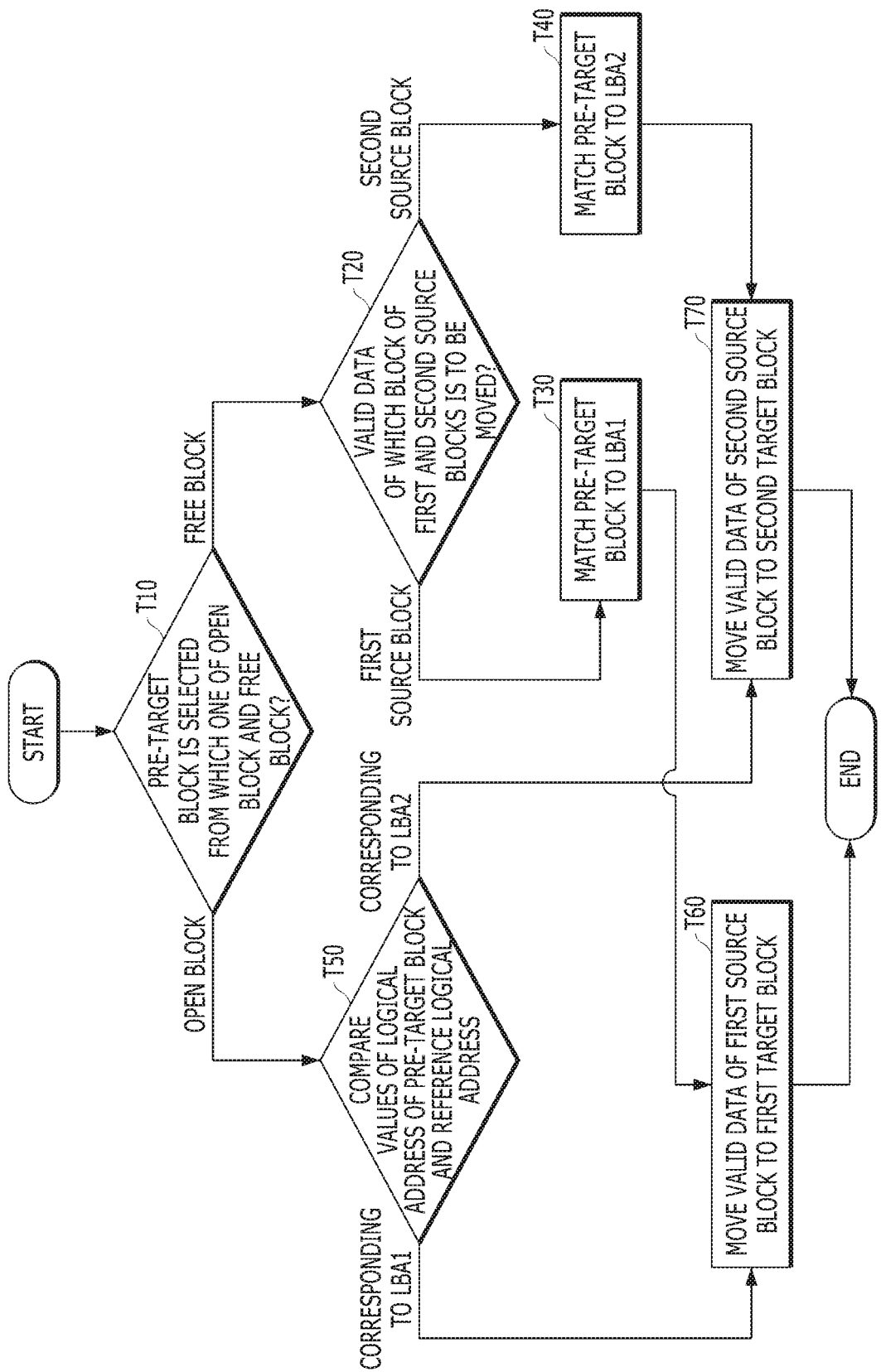
FIG. 8 is a flow chart illustrating a second operation of a merge operation performed in the memory system in accordance with the embodiment of the disclosure.

FIG. 8 is a flow chart illustrating a second operation of a merge operation performed in the memory system in accordance with the embodiment of the disclosure.

Referring to FIGS. 1 to 8, it may be seen how the controller 130 of the memory system 110 selects a target block for performing of a merge operation.

An operation of selecting a target block for performing of a merge operation may be performed by the controller 130 after, as described above with reference to FIG. 7, the step S20, the steps S30 and S40 are performed or the step S20, the steps S30 and S50 are performed. The step S20 may include selecting a pre-source block for performing of a merge operation. The steps S30 and S40 may include identifying the pre-source block as a first source block when the pre-source block corresponds to the first logical address LBA1. The steps S30 and S50 may include identifying the pre-source block as a second source block when the pre-source block corresponds to the second logical address LBA2.

In FIG. 8, the controller 130 may determine which block of an open block and a free block is to be selected as a pre-target block for performing of a merge operation (T10). Before the open block is selected as a pre-target block, the open block may be in a state in which it is matched to any one logical address of the first logical address LBA1 and the second logical address LBA2. Namely, in the case of an open block, new data may be additionally programmed in a state in which data is already stored therein. Therefore, before the open block is selected as a pre-target block, the corresponding open block may already be in a state in which it is matched to any one logical address of the first logical address LBA1 and the second logical address LBA2 in the course where data stored in the corresponding open block is programmed. Because the free block may be selected as a pre-target block in a state in which no data is stored therein, the free block may be in a state in which it is matched to no logical address, at a time when the free block is selected as a pre-target block.

When a free block is selected as a pre-target block (FREE BLOCK of the step T10), it may be checked that valid data of which block of the first source block and the second source block is to be moved to the pre-target block (T20).

When, the pre-source block is the first source block corresponding to the first logical address LBA1 (S40 of FIG. 7), it may correspond to a case in which valid data of the first source block is to be moved to the pre-target block. In the case in which, the pre-source block is the second source block corresponding to the second logical address LBA2 (S50 of FIG. 7), it may correspond to a case in which valid data of the second source block is to be moved to the pre-target block.

When valid data of the first source block is to be moved to the pre-target block (FIRST SOURCE BLOCK of the step T20), the pre-target block may be matched to the first logical address LBA1 to be identified as a first target block (T30). Then, valid data of the first source block may be moved to the first target block, and a merge operation may be completed (T60).

When valid data of the second source block is to be moved to the pre-target block (SECOND SOURCE BLOCK of the step T20), the pre-target block may be matched to the second logical address LBA2 to be identified as a second target block (T40). Then, valid data of the second source block may be moved to the second target block, and a merge operation may be completed (T70).

When an open block is selected as a pre-target block (OPEN BLOCK of the step T10), after a pre-target block is selected among memory blocks, a value of a logical address LBA corresponding to the pre-target block may be compared with a value of the reference logical address (T50).

As a result of comparing the value of the logical address LBA corresponding to the pre-target block and the value of the reference logical address, when the pre-target block is checked as a first target block corresponding to the first logical address LBA1 (CORRESPONDING TO LBA1 of the step T50), valid data of the first source block may be selected and may be moved to the first target block, and a merge operation may be completed (T60).

As a result of comparing the value of the logical address LBA corresponding to the pre-target block and the value of the reference logical address, when the pre-target block is checked as a second target block corresponding to the second logical address LBA2 (CORRESPONDING TO LBA2 of the step T50), valid data of the second source block may be selected and may be moved to the second target block, and a merge operation may be completed (T70).

As described above, when both valid data of the first source block and valid data of the second source block need to be moved to target blocks, by selecting a first target block as a free block or an open block and a second target block as a free block or an open block, valid data of the first source block may be moved to the first target block and valid data of the second source block may be moved to the second target block.

In the memory system 110, both a user block for storing user data from the host 102 and a metablock for storing metadata generated by the memory system 110 according to storage of user data may be managed in an integrated manner based on logical addresses. Therefore, the overlap and complexity of the program codes of a flash translation layer (FTL) for controlling the operations of the user block and the metablock in the memory system 110 may be reduced, and debugging may be easily implemented.

Also, in the memory system 110, the user block for storing user data from the host 102 may be managed through a first logical address used in the host 102, and the metablock for storing metadata generated by the memory system 110 according to storage of user data may be managed through a second logical address not used in the host 102. Therefore, the host may not be aware that the memory system 110 manages not only a user block but also a metablock in an integrated manner based on logical addresses. Accordingly, the operation of the memory system 110 which manages the user block and the metablock in the integrated manner based on logical addresses may not exert any influence on the operation of the host 102.

Although various embodiments have been described for illustrative purposes, it will be apparent to those skilled in the art that various changes and modifications may be made without departing from the spirit and scope of the invention as defined in the following claims.

What is claimed is:

1. A memory system comprising:
a nonvolatile memory device including a plurality of memory blocks, each memory block including a plurality of pages; and
a controller suitable for controlling the nonvolatile memory device to store user data received from a host in a first block among the memory blocks, to store metadata in a second block among the memory blocks, and to generate the metadata corresponding to storage of the user data,
wherein the controller maps a first logical address used in the host to a physical address of the first block, and maps a second logical address not used in the host, to a physical address of the second block, the first logical address and the second logical address being successive,
wherein the controller sets a reference logical address for identifying the first logical address and the second logical address,
wherein the controller selects a pre-source block corresponding to a predetermined condition for a merge operation, among the memory blocks, compares a logical address of the pre-source block with the reference logical address, and identifies the pre-source block as one of a first source block and a second source block depending on a comparison result,
wherein the controller selects an open block among the memory blocks as a pre-target block, and
wherein, in response to the open block being selected as the pre-target block, the controller identifies the pre-target block corresponding to the first logical address, as the first target block, and identifies the pre-target block corresponding to the second logical address, as the second target block, by comparing a logical address of the pre-target block with the reference logical address.

2. The memory system according to claim 1, wherein the controller shares a range of the first logical address with the host, selects the first block among the memory blocks in response to the first logical address received from the host, and maps the physical address of the selected first block to the first logical address.

3. The memory system according to claim 2,
wherein the controller sets a range of the second logical address, which is not overlapped with and is successive to the range of the first logical address, and
wherein, when the metadata is generated, the controller selects the second block among the memory blocks in response to the second logical address, and maps the physical address of the selected second block to the second logical address.

4. The memory system according to claim 3, wherein the controller moves valid data of the first source block corresponding to the first logical address, to the first target block corresponding to the first logical address, and moves valid data of the second source block corresponding to the second logical address, to the second target block corresponding to the second logical address.

5. The memory system according to claim 1, wherein, when a free block among the memory blocks is selected as the pre-target block, the controller identifies the pre-target block as the first target block by mapping a physical address of the pre-target block to the first logical address, and identifies the pre-target block as the second target block by mapping a physical address of the pre-target block to the second logical address.

6. The memory system according to claim 1, wherein the controller sets a specific value greater than a maximum value of the range of the first logical address, as a minimum value of the range of the second logical address, and sets the specific value as a value of the reference logical address.

7. The memory system according to claim 1, wherein the controller sets a specific value less than a minimum value of the range of the first logical address, as a maximum value of the range of the second logical address, and sets the specific value as a value of the reference logical address.

8. The memory system according to claim 1,
wherein, when the predetermined condition is whether the number of valid pages is less than or equal to a reference number, the controller selects the pre-source block to perform garbage collection as the merge operation,
wherein, when the predetermined condition is whether a read count is less than or equal to a first reference count, the controller selects the pre-source block to perform read reclaim as the merge operation, and wherein, when the predetermined condition is whether a program/erase cycle count is greater than or equal to a second reference count, the controller selects the pre-source block to perform wear levelling as the merge operation.

9. A method for operating a memory system including a nonvolatile memory device including a plurality of memory blocks each memory block including a plurality of pages, the method comprising:
storing user data received from the host in a first block among the memory blocks, a physical address of the first block mapped to a first logical address used in a host;
generating metadata corresponding to storage of the user data;
storing the metadata in a second block among the memory blocks, a physical address of the second block mapped to a second logical address not used in the host; and
selecting a source block and a target block among the memory blocks to perform a merge operation of moving valid data of the source block to the target block,
wherein the first logical address and the second logical address are successive,
wherein the selecting of the source block and the target block comprises: setting a reference logical address for identifying the first logical address and the second logical address; selecting a pre-source block corresponding to a predetermined condition for the merge operation, among the memory blocks; comparing a logical address of the pre-source block selected in the pre-selecting act, with the reference logical address; and identifying the pre-source block as one of a first source block and a second source block depending on a comparison result,
wherein the controller selects an open block among the memory blocks as a pre-target block, and
wherein, in response to the open block being selected as the pre-target block, the selecting of the source block and the target block further comprises: comparing a logical address of the pre-target block with the reference logical address; identifying the pre-target block corresponding to the first logical address, as the first target block, based on the comparing result; and identifying the pre-target block corresponding to the second logical address, as the second target block, based on the comparing result.

10. The method according to claim 9, wherein the storing of the user data comprises:
sharing a range of the first logical address with the host; and
selecting the first block among the memory blocks in response to the first logical address received from the host, and mapping the physical address of the selected first block to the first logical address.

11. The method according to claim 10, wherein the storing of the metadata comprises:

setting a range of the second logical address which is not overlapped with and is successive to the range of the first logical address; and
when the metadata is generated, selecting the second block among the memory blocks in response to the second logical address, and mapping the physical address of the selected second block to the second logical address.

12. The method according to claim 11,
wherein the selecting of the source block and the target block comprises:
when the first source block corresponding to the first logical address is selected, selecting a first target block corresponding to the first logical address, and moving valid data of the first source block, to the first target block; and
when the second source block corresponding to the second logical address is selected, selecting a second target block corresponding to the second logical address, and moving valid data of the second source block, to the second target block.

13. The method according to claim 9, wherein, when a free block among the memory blocks is selected as the pre-target block, the selecting of the source block and the target block further comprises:
identifying the pre-target block as the first target block by mapping a physical address of the pre-target block to the first logical address; and
identifying the pre-target block as the second target block by mapping a physical address of the pre-target block to the second logical address.

14. The method according to claim 9, wherein the setting of the reference logical address comprises setting a specific value greater than a maximum value of the range of the first logical address, as a minimum value of the range of the second logical address, and setting the specific value as a value of the reference logical address.

15. The method according to claim 9, wherein the setting of the reference logical address comprises setting a specific value less than a minimum value of the range of the first logical address, as a maximum value of the range of the second logical address, and setting the specific value as a value of the reference logical address.

16. The method according to claim 9, wherein the selecting of the pre-source block comprises:
when the predetermined condition is whether the number of valid pages is less than or equal to a reference number, selecting the pre-source block to perform garbage collection as the merge operation;
when the predetermined condition is whether a read count is less than or equal to a first reference count, selecting the pre-source block to perform read reclaim as the merge operation; and
when the predetermined condition is whether a program/erase cycle count is greater than or equal to a second reference count, selecting the pre-source block to perform wear leveling as the merge operation.

* * * * *